United States Patent [19]

Meier

[11] Patent Number: 5,471,546
[45] Date of Patent: Nov. 28, 1995

[54] FIBER-OPTIC TRANSMISSION SENSOR WITH MODULATOR

[75] Inventor: Markus Meier, Aarau, Switzerland

[73] Assignee: ABB Research Ltd., Zurich, Switzerland

[21] Appl. No.: 354,809

[22] Filed: Dec. 13, 1994

[30] Foreign Application Priority Data

Dec. 29, 1993 [DE] Germany .................. 43 44 856.9

[51] Int. Cl.⁶ .............................. G01C 19/64; G02B 6/17
[52] U.S. Cl. .............................................. 385/11; 356/350
[58] Field of Search ................................. 385/11–13, 24, 385/31, 122; 356/350, 351; 372/6, 18, 20, 21, 22, 30; 250/227.11, 227.17, 227.21, 227.24

[56] References Cited

U.S. PATENT DOCUMENTS

| | | | |
|---|---|---|---|
| 4,529,312 | 7/1985 | Pavlath et al. | 356/350 |
| 4,615,582 | 10/1986 | Lefevre et al. | 385/12 X |
| 4,733,938 | 3/1988 | Lefevre et al. | 385/11 X |
| 4,915,503 | 4/1990 | Pavlath | 356/350 |
| 4,997,282 | 3/1991 | Pavlath | 356/350 |
| 5,335,064 | 8/1994 | Nishiura et al. | 385/11 X |
| 5,377,283 | 12/1994 | Blake et al. | 385/11 |
| 5,386,484 | 1/1995 | Ooka et al. | 385/11 |

OTHER PUBLICATIONS

"Faseroptische Sensoren, Teil 1: Grundlagen", K. Bohnert, Bulletin SEV/VSE 82 (1991), pp. 17–20. (No Month).
"Faseroptische Sensoren, Teil 2: Faseroptische Stromsensoren", R. Stierlin, Bulletin SEV/VSE 82 (1991), pp. 21–29. (No Month).

*Primary Examiner*—Akm E. Ullah
*Attorney, Agent, or Firm*—Burns, Doane, Swecker & Mathis

[57] ABSTRACT

Fiber-optic sensors are used in reflection or transmission operation in almost all fields of measuring technology, inter alia for monitoring industrial installations, in medical diagnostics and in aerospace. In this context, the effects of mechanical, electrical, magnetic, acoustic, thermal and chemical signals are evaluated. In order to make possible a simpler signal evaluation, laser light from a light source is coupled into a feed line optical fiber parallel to one of its two principal axes. At a 1st splice point, the light is introduced into a 1st reference optical fiber, whose principal axes are rotated with respect to those of the feed line optical fiber by 45°. At a 2nd splice point, the light reaches a 2nd reference optical fiber of the same length as the 1st reference optical fiber and with its principal axes rotated with reference to the 1st reference optical fiber by 90°. At a 3rd splice point, the light is coupled into a low-birefringent optical fiber, which firstly forms a $\lambda/4$-fiber-optic loop and subsequently forms an optical sensor. By means of a phase modulator (M) in conjunction with the 1st reference optical fiber, the phase shift of the light can be influenced statically or dynamically.

5 Claims, 1 Drawing Sheet

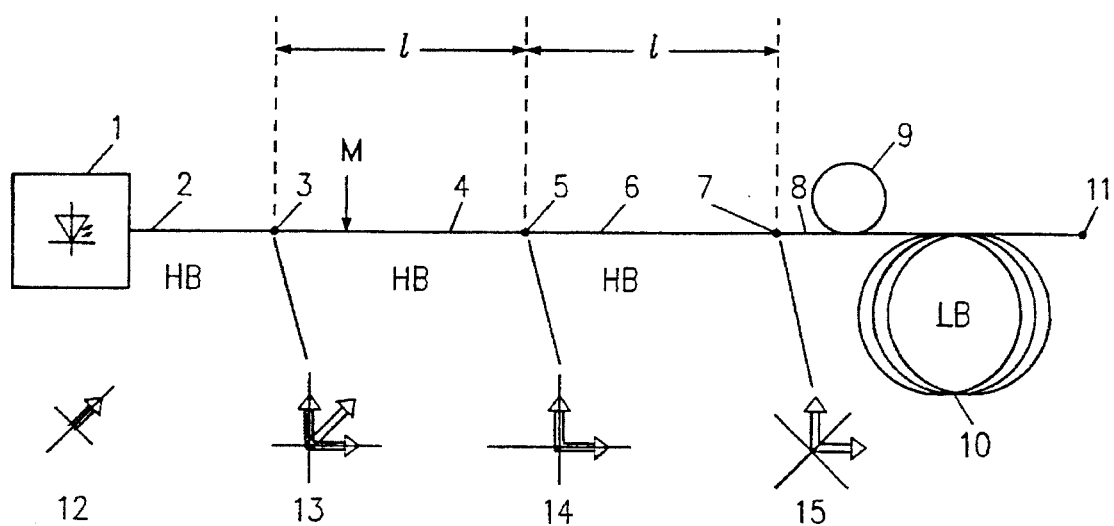

FIBER-OPTIC TRANSMISSION SENSOR WITH MODULATOR

BACKGROUND OF THE INVENTION

1. Field of the Invention

The starting point of the invention is a fiber-optic transmission sensor with modulator according to the precharacterizing clause of patent claim 1.

2. Discussion of Background

With the precharacterizing clause of patent claim 1, the invention refers to a prior art as is disclosed by Roland Stierlin, Faseroptische Sensoren [Fiber-optic sensors], Bulletin SEV/VSE 82 ( 1991), pp. 21–29. In the Sagnac sensor type described there in conjunction with FIG. 8, linearly polarized laser light is fed in parallel in 2 HB (high-birefringence) optical fibers to the sensor head and from there, in mutually opposing directions, via 2 $\lambda/4$-plates into the sensor fiber. The two $\lambda/4$-plates are at 45° to the direction of the linear polarization in the respective HB fiber, so that right-circularly polarized light reaches the sensor fiber from both sides. The sensor fiber is a twisted LB (low-birefringence) glass fiber. After the passage through the respective second $\lambda/4$-plate, the light is once more converted back into the linear polarization condition. The polarization direction of the emergent light is, in so doing, parallel to that of the entry light. The light is fed back via the two HB glass fibers and is combined in a transmitting-evaluating unit in a first brancher and is coupled out from the input light path via an input polarizer in a second brancher. Using this Sagnac current sensor, the phase difference of the two light beams is measured by interference formation. A phase modulator, by means of which both light beams are phase-modulated, is fitted in an HB glass fiber, for example by sticking a wound portion of the HB glass fiber firmly on a piezoelectric element. By means of the propagation time difference which is produced by the right and left circulating light beam not passing the modulator at the same time, the phase of the two light beams is modulated in a different cycle. An analysis of the periodic change of the interference signal produces a DC and an AC current component of the modulation frequency, which components are evaluated by the formation of a ratio, as well as higher harmonics. The length of the sensor fiber is matched to the intensity and the frequency of the phase modulation. One of the 2 independent light beams is used as a reference for the other.

The signal evaluation in this type of sensor is relatively costly.

SUMMARY OF THE INVENTION

Accordingly, one object of the invention, as it is defined in patent claim 1, is to provide a novel development of a fiber-optic transmission sensor with modulator of the type cited at the beginning in such a way that a simpler signal evaluation becomes possible.

One advantage of the invention comprises a comparatively simple construction of the light transmission path from a light source to the glass fiber sensor. A temperature-dependent rotation of twisted fiber coils can at the same time be compensated for.

BRIEF DESCRIPTION OF THE DRAWING

A more complete appreciation of the invention and many of the attendant advantages thereof will be readily obtained as the same becomes better understood by reference to the following detailed description when considered in connection with the accompanying drawing, wherein a light transmission from a light source via HB optical fibers into a sensor fiber is shown schematically in the single figure.

DESCRIPTION OF THE PREFERRED EMBODIMENTS

Referring now to the drawing, monochromatic light from a monochromatic light source (1), preferably from a laser diode, is coupled via a monochromator, not shown, into a polarization-maintaining, highly birefringent so-called HB optical fiber or feed line optical fiber (2) with 2 optical principal axes, that is to say with a 1st optical principal axis and a 2nd orthogonal thereto. In the 1st optical principal axis of the feed line glass fiber (2), the propagation velocity of the light is greater than in the second optical principal axis. The polarization direction of the light to be coupled in from the light source (1) is parallel to one of the two optical principal axes of the feed line optical fiber (2).

At an optical coupling point or splice point (3), the feed line optical fiber (2) is connected optically to a polarization-maintaining, highly birefringent HB optical fiber or 1st reference optical fiber (4) having 2 optical principal axes, that is to say with a 1st optical principal axis and a 2nd orthogonal thereto, the two optical principal axes of the 1st reference optical fiber (4) being rotated with respect to the two principal axes of the feed line optical fiber (2) by 45°. At a further splice point (5), the first reference optical fiber (4) is connected to a 2nd reference optical fiber (6) of identical construction, the two optical principal axes of the 1st reference optical fiber (4), however, being rotated with respect to the two principal axes of the 2nd reference optical fiber (6) by 90°. The 1st reference optical fiber (4) has the same length (1) as the 2nd reference optical fiber (6).

At a 3rd splice point (7), the 2nd reference optical fiber (6) is connected optically to a low-birefringent so-called LB optical fiber or optical fiber (8). The optical fiber (8) at first forms a $\lambda/4$-fiber-optic loop (9) and subsequently, in a plurality of loops, an optical sensor (10) or Faraday sensor, for example for the detection of a current through a power cable (not shown) in the interior of the sensor loop (10). An output (11) of the optical fiber (8) can be connected optically (not shown) to a polarimeter or a further modulator or to an HB optical fiber.

A plane of oscillation of the light emerging from the light source (1) parallel to a principal axis of the feed line optical fiber (2) is designated by (12). (13) designates a plane of oscillation of the light at the output of the splice point (3). Because the two HB optical fibers (2, 4) coupled to each other at the splice point (3) are rotated with respect to the direction of their principal axes by 45°, light of the same amplitude is coupled into both polarization-maintaining principal axes. The planes of oscillation of the light at the splice points (5) and (7) are designated by (14) and (15), respectively.

After a length (1) in the 1st reference optical fiber (4), the light can be in an undefined condition, that is to say can be partially coherent or non-coherent. Since the roles of the two principal axes are exchanged at the splice point (5), each polarization component from the input of the 1st reference optical fiber (4) at the splice point (7) has passed through virtually the same optical path, that is to say both polarization components are once more coherent. The relative phase is not known exactly; it depends on asymmetries in the two 1st and 2nd reference optical fibers (4, 6), that is to say on temperature fluctuations and production fluctuations.

By using a phase modulator (M), the phase shift can be influenced, either statically with a DC component or dynamically with a prescribable frequency, At the entry of the two polarization components into the $\lambda/4$ fibre-optic loop (9), one component is converted into a right-circularly polarized component and the other into a left-circularly polarized component. The position of the linear polarization, that is to say the sum of right-circularly polarized and left-circularly polarized components, is determined at the input of the optical fiber (8) by the relative phase between the two polarization components of the 2nd reference optical fiber (6), which can be influenced with the phase modulator (M).

The fiber-optic transmission sensor according to the invention can be used as the polarization setting element at the input of the LB optical fiber (8). Control is carried out by means of the DC component of the phase modulator (M). The polarization direction can be determined better with a weak frequency modulation. A phase modulation of a Faraday modulation can be effected with a strong frequency modulation.

If the fiber-optic transmission sensor is inserted at the output of the 2nd reference optical fiber (6) (with a reversed sequence of the light components), it can then be determined which polarization direction at the output (11) of the optical fiber (8) symmetrically reaches the polarimeter not shown.

Using 2 phase modulators (M) (not shown), the transfer matrix of the coil of the sensor optical fiber (10) can be determined.

It goes without saying that, instead of a $\lambda/4$-fiber-optic loop (9), as an example, a $\lambda/4$-delay plate can be used. Instead of the sensor optical fiber (10), a solid optical sensor could be used.

Obviously, numerous modifications and variations of the present invention are possible in light of the above teachings. It is therefore to be understood that, within the scope of the appended claims, the invention may be practiced otherwise than as specifically described herein.

What is claimed as new and desired to be secured by Letters Patent of the United States is:

1. A fiber-optic transmission sensor
   a) having a light source,
   b) which, via a polarization-maintaining, highly birefringent 1st reference optical fiber having a 1st optical principal axis and a 2nd orthogonal thereto, the propagation velocity of the light in the 1st optical principal axis being greater than in the 2nd optical principal axis, and
   c) via a polarization-maintaining, highly birefringent 2nd reference optical fiber having a 1st optical principal axis and a 2nd orthogonal thereto, the propagation velocity of the light in the 1st optical principal axis being greater than in the 2nd optical principal axis, and
   d) via a $\lambda/4$-delay device, is connected optically to an optical sensor,
   e) in addition having at least one phase modulator, which is operatively connected to one of the two 1st and 2nd reference optical fibers, wherein,
   f) the 1st reference optical fiber has the same length as the 2nd reference optical fiber and
   g) is connected optically to the latter, rotated by 90°, in such a way that the 1st optical principal axis of the 1st reference optical fiber is connected to the 2nd optical principal axis of the 2nd reference optical fiber, and the 2nd optical principal axis of the 1st reference optical fiber to the 1st optical principal axis of the 2nd reference optical fiber.

2. The fiber-optic transmission sensor as claimed in claim 1, wherein the light source is connected optically via a polarization-maintaining, highly birefringent feed line optical fiber having a 1st optical principal axis and a 2nd orthogonal thereto, the propagation velocity of the light in the 1st optical principal axis being greater than in the 2nd optical principal axis, to the 1st reference optical fiber, rotated by 45° with reference to the 1st and 2nd optical principal axes of the latter, in such a way that the 1st and 2nd optical principal axes of the 1st reference optical fiber form an angle of 45° with the 1st and 2nd optical principal axes of the feed line optical fiber.

3. The fiber-optic transmission sensor as claimed in claim 1, wherein the $\lambda/4$-delay device is a $\lambda/4$-loop of a low-birefringent fiber.

4. The fiber-optic transmission sensor as claimed in claim 1, wherein the $\lambda/4$-delay device is optically coupled to the 2nd reference optical fiber.

5. The fiber-optic transmission sensor as claimed in claim 1, wherein the $\lambda/4$-delay device and the optical sensor comprise a single, low-birefringent optical fiber.

* * * * *